United States Patent [19]

Watanabe et al.

[11] 4,400,732
[45] Aug. 23, 1983

[54] PCM SIGNAL EXTRACTING CIRCUIT

[75] Inventors: Yasuaki Watanabe, Kasukabe; Kenji Kaneko, Iwai, both of Japan

[73] Assignee: Victor Company of Japan, Kanagawa, Japan

[21] Appl. No.: 332,157

[22] Filed: Dec. 18, 1981

[30] Foreign Application Priority Data

Dec. 22, 1980 [JP] Japan ................ 55/181575

[51] Int. Cl.³ ............................................. H04N 7/08
[52] U.S. Cl. .................................................. 358/147
[58] Field of Search ................ 358/147, 170, 171, 174

[56] References Cited

U.S. PATENT DOCUMENTS 4,170,026 10/1979 Nagaoka et al. ...................... 358/147
4,318,127 3/1982 Fukuda et al. ....................... 358/147
4,318,128 3/1982 Sauvanet ............................. 358/147
4,358,790 11/1982 Summers ............................. 358/147

Primary Examiner—Richard Murray
Attorney, Agent, or Firm—Posnack, Roberts, Cohen & Spiecens

[57] ABSTRACT

A PCM signal extracting circuit comprises a highpass filter for separating a PCM signal, of a type not including a DC component, inserted between horizontal synchronizing signals within a predetermined interval of a composite video signal or a signal based on the composite video signal, and for obtaining an average DC level of the horizontal synchronizing signal and the PCM signal, an attenuation circuit for attenuating an output signal of the highpass filter by a predetermined quantity according to the modulation factor of the PCM signal, a holding circuit for holding a peak value, at the opposite side from the horizontal synchronizing signal, of the signal attenuated by the attenuation circuit, and a level comparing circuit for comparing the levels of output signals of the highpass filter and the holding circuit, and extracting a signal obtained by slicing the output signal of the highpass filter by the level of the output signal of the holding circuit. The attenuation circuit attenuates the PCM signal so that the level of the peak value, at the opposite side from the horizontal synchronizing signal, of the attenuated PCM signal, is equal to a level shifted towards a side opposite from the horizontal synchronizing signal by kx% from an average DC level of the PCM signal before attenuation, where k is a constant, and a distance between the average DC level of the PCM signal and the peak value of the PCM signal at the opposite side from the horizontal synchronizing signal is designated by x% where the distance between the pedestal of the horizontal synchronizing signal and the white peak level is expressed as 100%.

6 Claims, 4 Drawing Figures

PCM SIGNAL EXTRACTING CIRCUIT

BACKGROUND OF THE INVENTION

The present invention generally relates to pulse code modulated (PCM) signal extracting circuits, and more particularly to a circuit for accurately extracting a PCM signal inserted within a composite video signal or a signal having a format based on the composite video signal.

Presently, in addition to a composite video signal recorded in a recording medium such as a rotary recording medium (so-called video disc) and a magnetic tape, a data signal indicating the information content of the video signal and/or the recorded position (or time) of the video signal is recorded at a position which does not affect the video signal content, that is, at a predetermined position within a vertical blanking period, for example, in the form of a PCM signal. The above data signal is, for example, a signal indicating a program address or chapter address of the recorded video signal, an address of a position where the information content of the video signal is recorded or the playing time up to that position from when recording (reproduction) was started, and the like. This data signal is also used in a signal in which the information signal is not a video signal, but is of a format having a synchronizing signal, based on a composite video signal recorded with a PCM signal which is an audio signal, within an interval for the video signal, between the synchronizing signals.

In an apparatus for reproducing a recording medium recorded with the above described signal, a circuit for extracting the data signal recorded at the predetermined position within the vertical blanking period is constructed to clamp a pedestal level of the horizontal synchronizing signal. Further, the data signal is sliced at a 50% level of the amplitude of the data signal (PCM signal), with respect to the clamping level, to extract the data signal. The reason for slicing the PCM signal at the above 50% level is because when the PCM signal indicating the data is reproduced, the waveform is distorted and is not reproduced in the form of a square wave. Accordingly, when the PCM signal is sliced at a level other than the 50% level which corresponds to exactly half the amplitude (peak-to-peak), the duty cycle of the signal obtained by the slicing becomes different, and an accurate data extracting operation cannot be performed.

Even when reproducing the same recording medium, the data signal may be reproduced with different peak values when reproduced by different reproducing apparatuses. Moreover, in a case where the type of the recording medium is changed, or due to some other causes, the data signal may be reproduced with a different peak value even when reproduction is performed by use of the same reproducing apparatus. In this case, since the slicing level is obtained with reference to the clamping level and is always constant in the conventional PCM signal extracting circuit, there was a disadvantage in that the slicing level does not always and relatively become 50% and an accurate signal extraction could not be performed. Furthermore, in the manufacturing process of the reproducing apparatus, an operation is required to adjust the slicing level so that the slicing level accurately becomes 50%.

SUMMARY OF THE INVENTION

Accordingly, it is a general object of the present invention to provide a novel and useful PCM signal extracting circuit in which the above described disadvantages have been overcome.

Another and more specific object of the present invention is to provide a PCM signal extracting circuit which is capable of always and accurately extracting the PCM signal at ½ (50% level of) the amplitude of the PCM signal even when the peak value of the PCM signal varies. According to the circuit of the present invention, the extraction of the PCM signal is performed by setting the slicing level to a level obtained by shifting an average direct-current (DC) level including the PCM signal and the horizontal synchronizing signal by a level corresponding to a predetermined percentage, towards a direction opposite to the horizontal synchronizing signal.

Other objects and further features of the present invention will be apparent from the following detailed description when read in conjunction with the accompanying drawings.

DETAILED DESCRIPTION

Description will be given with respect to an example of a case where the PCM signal extracting circuit according to the present invention is applied to a rotary recording medium reproducing apparatus. For example, the rotary recording medium (disc) is recorded with a composite video signal. A PCM signal of a chapter data indicating a recorded information program number, is recorded with 1 H (H indicates a horizontal scanning period) at a position which is 19 H from the start of a vertical synchronizing signal within a vertical blanking period of the composite video signal. Moreover, a PCM signal of a time address data indicating the playing time of the recorded information from a point where recording (reproduction) of the disc is started, is recorded within 1 H at a position which is 20 H from the start of the above vertical synchronizing signal within the vertical blanking period of the composite video signal. The above PCM signals are of a type not including a direct-current (DC) component, such as a bi-phase space code type.

Figure 1:
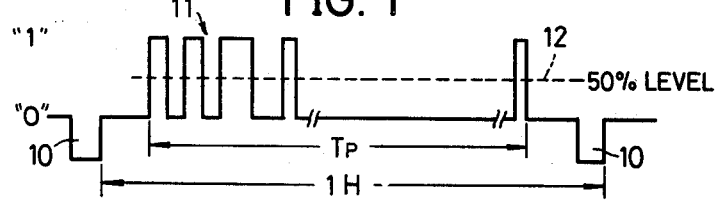
FIG. 1 is a diagram for explaining a PCM signal which is to be extracted, and a slicing level of a conventional circuit.

As indicated in FIG. 1, for example, a PCM signal 11 is inserted within an interval Tp as a data signal, excluding intervals of the synchronizing signal and pedestals between horizontal synchronizing signals 10 and 10 (an interval of 1 H) within the vertical blanking period. This PCM signal 11 is shown as having an ideal waveform, however, in an actual reproduced signal, the waveform of the PCM signal is distorted and is not an accurate square wave. Accordingly, when the above reproduced PCM signal is to be extracted, it is necessary to slice the PCM signal at a 50% level of the peak-to-peak value (in FIG. 1, the lower peak value is equal to the pedestal level) indicated by a dotted line 12 in FIG. 1.

Conventionally, when extracting the above PCM signal, the pedestal level of the horizontal synchronizing signal is clamped to set a level which is considered to be the 50% level of the amplitude of the PCM signal with reference to the above clamped level, and the set level was used as the slicing level. Accordingly, in a case where the peak value of the PCM signal varies, there was a disadvantage in that the fixed slicing level became not relatively 50% with respect to the PCM signal.

Figure 2:
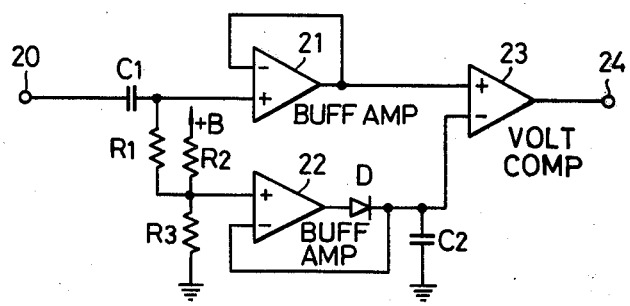
FIG. 2 is a systematic circuit diagram showing an embodiment of a PCM signal extracting circuit according to the present invention.

The present invention has eliminated the above problem related to the conventional circuit, and an embodiment of such a PCM signal extracting circuit will now be described in conjunction with FIG. 2. In FIG. 2, a signal which is reproduced from a recording medium and demodulated, is applied to an input terminal 20. A signal spectrum component of the PCM signal is separated from the reproduced signal by a capacitor C1 constructing a highpass filter, and then supplied to a buffer amplifiers 21 and 22. In addition, by intercepting the DC component at the capacitor C1, an average DC level (hereinafter simply referred to as APL) including the horizontal synchronizing signal and the PCM signal is accordingly obtained and supplied to the buffer amplifiers 21 and 22. A resistor R1 is connected across the buffer amplifier 22 and a connection point between the capacitor C1 and the buffer amplifier 21. A resistor R2 is connected across a power source +B and a connection point between the resistor R1 and the buffer amplifier 22. On the other hand, a resistor R3 is connected across ground and the connection point between the resistor R1 and the buffer amplifier 22. Hence, the above buffer amplifiers 21 and 22 are biased by these resistors R2 and R3. In addition, a signal which is attenuated by a predetermined quantity, described hereinafter, than an input level of the buffer amplifier 21, is applied to the buffer amplifier 22. The above attenuation quantity differs according to the format, the modulation factor, and the like of the signal.

Figure 3:
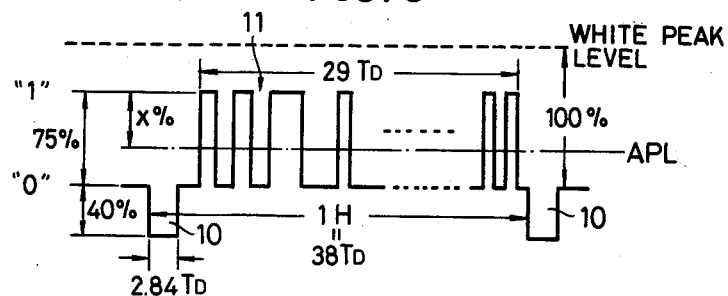
FIG. 3 is a diagram for explaining the slicing level of the PCM signal extracting circuit according to the present invention.

The operating principle of the PCM signal extracting circuit according to the present invention will be described by referring to FIG. 3. In this example, the data rate is $38f_H$ where $f_H$ indicates the horizontal scanning frequency. That is, when the period of the data is designated by $T_D$, 1 H interval is equal to $1/f_H$, and also equal to $38T_D$. Excluding the synchronizing signal and the pedestal part within the above $38T_D$ interval, the PCM signal 11 exists within an interval of $29T_D$ as the data signal. A level "0" of the PCM signal is equal to the pedestal level, and the lever "1" is equal to 75% of the white peak level (level upon 100% modulation of white), that is, 75IRE. The above PCM signal is a biphase space code signal and the like not including the DC component, as in the above described case.

The width of the horizontal synchronizing signal 10 is multiplied by a number which is 2.84 times the data period $T_D(=1/38f_H)$. Then, when considering the APL of PCM signal including the horizontal synchronizing signal, the APL is at a level position shifted near the synchronizing signal side than the 50% level of the PCM signal, by a quantity corresponding to the quantity of the horizontal synchronizing signal considered. The above shifted quantity of the APL from the 50% level is determined according to an areal ratio between the PCM signal and the horizontal synchronizing signal. By considering the above, and designating the distance from the APL to the logic "1" level (75IRE) of the PCM signal by x%, the shifted quantity of the APL from the 50% level becomes kx%, where k is a constant equal to 0.1522, for example. The above value of the shifted quantity is an example for the case where the synchronizing signal and the like are in accordance with the broadcasting standards. Hence, in a case of the previously proposed video disc, the value of the above constant k becomes equal to 0.3. The shifted quantity assumes a value between approximately $\frac{1}{8} \times \%$ to approximately $\frac{1}{2} \times \%$, according to the signal format. That is, the constant k is selected to a value in a range between $\frac{1}{8}$ to $\frac{1}{2}$. Accordingly, all that is required is to set the slicing level to a level obtained by offsetting the APL by a quantity equal to the above shifted quantity of kx% in a direction opposite to the synchronizing signal.

Therefore, what is required is to select the resistances of the resistors R1 through R3 so that $k=(R2||R3)/R1+R2||R3)$, where a composite resistance of the resistors R2 and R3 connected in parallel is designated by R2 R3 $(=R2 \cdot R3/R2+R3)$. Thus in a case where the shifted quantity is to be set to $0.1522 \times \%$, $(R2||R3)/(R1+R2||R3)=0.1522$. In this case, for example, the resistances for the resistors R1 through R3 are respectively selected as R1=28 kΩ, and R2=R3=10 kΩ.

The signal which is attenuated by the attenuating circuit consisting of the resistors R1, R2, and R3 and which has passed through the buffer amplifier 22, is supplied to a holding circuit consisting of a capacitor C2 through a diode D. The above capacitor C2 holds the peak value of the attenuated and amplified signal which is on the opposite side from the horizontal synchronizing signal. This held peak value is equal to the level which is shifted towards the horizontal synchronizing signal by kx% from the APL of the PCM signal before it is attenuated. The held peak value (peak level) is supplied to a voltage comparator 23 consisting of an operational amplifier, and compared with the voltage of the signal which has passed through the buffer amplifier 21. Accordingly, a signal obtained by slicing the signal from the buffer amplifier 21, by the attenuated peak value from the holding circuit which has been held, is obtained from the above voltage comparator 23. Therefore, a signal obtained by accurately extracting the PCM signal, is obtained through an output terminal 24.

Figure 4:
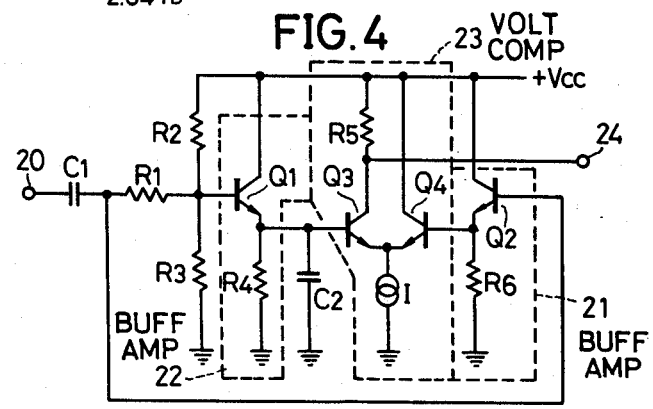
FIG. 4 is a circuit diagram showing an embodiment of a concrete circuit corresponding to the circuit shown in FIG. 2.

An embodiment of a concrete circuit of the circuit system shown in FIG. 2, is shown in FIG. 4. In FIG. 4, those parts which are the same as those corresponding parts in FIG. 2 are designated by like reference numerals. A transistor Q1 of an emitter-follower whose base is connected to a connection point of the resistors R1, R2, and R3, corresponds to the buffer amplifier 22 and the diode D. The time constant of a resistor R4 and the capacitor C2 connected to the emitter of the transistor Q1 determines the time constant of the above described peak-hold. A transistor Q2 having its base connected to the connection point between the capacitor C1 and the resistor R1, constructs the buffer amplifier 21 shown in FIG. 2. Transistors Q3 and Q4 having their bases respectively connected to the emitters of the transistors Q1 and Q2, and their emitters respectively connected to a constant current source I, construct a differential amplifier which corresponds to the voltage comparator 23 shown in FIG. 2. This differential amplifier performs a voltage comparison between the reproduced input signal obtained through the transistor Q2 and a signal which is further passed through the transistor Q1 and held of its peak. An output digital signal obtained as a result of the above voltage comparison, is obtained through the output terminal 24 which is connected to the collector of the transistor Q3.

In the circuit shown in FIG. 4, the transistors Q1 through Q4 are NPN-transistors, respectively. However, the circuit may be constructed by the use of PNP-transistors. In this case, the polarity of the power source is reversed.

Further, the present invention is not limited to these embodiments, but various variations and modifications may be made without departing from the scope of the present invention.

What is claimed is:

1. A PCM signal extracting circuit comprising:
    a highpass filter for separating a PCM signal, of a type not including a DC component, inserted between horizontal synchronizing signals within a predetermined interval of a composite video signal or a signal based on the composite video signal, and for obtaining an average DC level of said horizontal synchronizing signal and the PCM signal;
    an attenuation circuit for attenuating an output signal of said highpass filter by a predetermined quantity according to the modulation factor of said PCM signal;
    a holding circuit for holding a peak value, at the opposite side from the horizontal synchronizing signal, of the signal attenuated by said attenuation circuit; and
    a level comparing circuit for comparing the levels of output signals of said highpass filter and said holding circuit, and extracting a signal obtained by slicing the output signal of said highpass filter by the level of the output signal of said holding circuit,
    said attenuation circuit attenuating said PCM signal so that the level of the peak value, at the opposite side from the horizontal synchronizing signal, of said attenuated PCM signal, is equal to a level shifted towards a side opposite from the horizontal synchronizing signal by kx% from an average DC level of said PCM signal before attenuation, where k is a constant, and a distance between the average DC level of the PCM signal and the peak value of said PCM signal at the opposite side from the horizontal synchronizing signal is designated by x% where the distance between the pedestal of the horizontal synchronizing signal and the white peak level is expressed as 100%.

2. A PCM signal extracting circuit as claimed in claim 1 in which the value of said constant k is selected to a value within a range between ⅛ to ¼.

3. A PCM signal extracting circuit as claimed in claim 1 in which said PCM signal is inserted within a predetermined horizontal scanning period within a vertical blanking period of said composite video signal or the signal based on said composite video signal.

4. A PCM signal extracting circuit as claimed in claim 1 further comprising a first buffer amplifier supplied with the output of said highpass filter and a second buffer amplifier supplied with the output of said attenuation circuit, said attenuation circuit consisting of a first resistor R1 connected across said highpass filter and an input terminal of said second buffer amplifier, a second resistor R2 connected across a power source and a connection point between said first resistor R1 and the input terminal of said second buffer amplifier, and a third resistor R3 connected across ground and the connection point between said first resistor R1 and the input terminal of said second buffer amplifier, said resistors R1, R2, and R3 respectively having resistances selected so as to satisfy an equation $$(R2||R3)/(R1+R2||R3)=k$$

where R2||R3 indicates a combined resistance of the resistors R2 and R3 connected in parallel.

5. A PCM signal extracting circuit as claimed in claim 4 in which said holding circuit is connected to an output side of said second buffer amplifier, and said level comparing circuit consists of a voltage comparing circuit for comparing voltages of outputs of said first buffer amplifier and said holding circuit.

6. A PCM signal extracting circuit as claimed in claim 4 in which said level comparing circuit consists of a differential amplifier having a pair of transistors respectively connected to said first buffer amplifier and said holding circuit.

* * * * *